United States Patent [19]

Skowronski et al.

[11] Patent Number: 5,876,850
[45] Date of Patent: Mar. 2, 1999

[54] COATING FOR CARBON-CARBON COMPOSITES AND METHOD FOR PRODUCING SAME

[76] Inventors: Raymund P. Skowronski, 22101 Erwin St., Apt. 106, Woodland Hills, Calif. 91367; David Kramer, 747 Reef Cir., Port Hueneme, Calif. 93041

[21] Appl. No.: 680,088

[22] Filed: Mar. 29, 1991

Related U.S. Application Data

[62] Division of Ser. No. 393,725, Aug. 15, 1989.

[51] Int. Cl.$^6$ ................................ B32B 9/00; B05D 5/12
[52] U.S. Cl. ...................... 428/408; 427/113; 427/380; 428/145; 428/325; 428/331
[58] Field of Search ..................................... 427/113, 380; 428/408, 195, 325, 331

[56] References Cited

U.S. PATENT DOCUMENTS

| | | | |
|---|---|---|---|
| 4,585,675 | 4/1986 | Shuford | 428/408 X |
| 4,613,522 | 9/1986 | Vasilos | 427/380 X |
| 4,892,790 | 1/1990 | Gray | 428/408 X |

*Primary Examiner*—Peter A. Nelson

[57] ABSTRACT

A coating for sealing carbon-carbon composites against hydrogen. The coating comprises a first layer of silicon carbide and a second layer of a glass, glass-ceramic or a low-melting-point metal such as tin or an alloy thereof. Particularly when such second layer is a glass, e.g. an $SiO_2$-containing glass, or a glass-ceramic, preferably the silicon carbide coating is pretreated, e.g. by oxidation thereof to form a thin layer of $SiO_2$ prior to application of the glass layer. The glass layer can be an $SiO_2$ glass formed by sputtering or by decomposition of tetraethylorthosilicate (TEOS) applied to the oxidized silicon carbide coating. An alkali metal oxide, e.g. $Na_2O$, or an alkaline earth metal oxide, e.g. BaO, can be added to the $SiO_2$ glass.

16 Claims, No Drawings

COATING FOR CARBON-CARBON COMPOSITES AND METHOD FOR PRODUCING SAME

This is a divisional of copending application Ser. No. 07/393,725 filed on Aug. 15, 1989.

STATEMENT OF GOVERNMENT INTEREST

The Government has rights in this invention pursuant to Contract F33657-87-C-2214 awarded by the U.S. Department of Air Force.

BACKGROUND OF THE INVENTION

1. Field of the Invention

This invention relates to the field of coatings, and is particularly concerned with a coating for sealing carbon-carbon composites against hydrogen.

2. Description of the Prior Art

Carbon-carbon composites have attained importance for use as aircraft structural materials, particularly on engines, e.g. exit nozzles, and airframes. Such composites are based on carbon fibers woven and formed into a structure, wherein carbon is both the fiber and the matrix forming the composite. The matrix can be a combination of graphitic carbon and amorphous carbon in certain percentages. Such composites can be produced in known manner by impregnating a carbon fiber structure with a resin, and heating the fiber impregnated resin at temperature sufficient to decompose the resin matrix and to volatilize all of the components of the resin except for the carbon.

In certain areas of aerospace use such as internal heat exchangers wherein the fuel is cryogenic hydrogen, such composites are placed into contact with the hydrogen. Carbon-carbon composites have potential for high temperature service. However, above 350° C. hydrogen can react with carbon to form methane, which degrades its properties. To the applicants' knowledge, this problem has not been satisfactorily addressed to date in the prior art.

SUMMARY OF THE INVENTION

According to the invention, basically a two-layer coating is provided to seal carbon-carbon composites against hydrogen. First, a layer of silicon carbide is formed on the carbon-carbon composite and a second layer of a glass, glass-ceramic or a low-melting point metal such as tin is applied over the first layer. All of these materials function as good hydrogen permeation barriers.

In preferred practice where the second layer is a glass or a glass-ceramic, the initial silicon carbide coating can be pretreated to form a thin layer of $SiO_2$ prior to application of the second layer. The thin layer of $SiO_2$ aids in bonding the silicon carbide layer to the glass or glass-ceramic layer. Such an $SiO_2$ layer can be formed, for example, by oxidation of the outer surface of the silicon carbide layer. The glass layer is preferably a silica-containing glass, and can be formed by glass-producing methods on the oxidized silicon carbide layer. Cations such as alkali metal cations, e.g. sodium, can be added, as in the form of $Na_2O$, to the silica-containing glass layer, to decrease gas permeation through the glass.

OBJECTS OF THE INVENTION

It is accordingly an object of the invention to provide a coating on carbon-carbon composites as a seal against hydrogen.

A further object is the provision of a coating for carbon-carbon composites which functions as a barrier to hydrogen diffusion, and which prevents contact of such composites with hydrogen to prevent reaction of hydrogen with the carbon-carbon composites, particularly at elevated temperature.

Yet another object is to provide a coating having the above characteristics on carbon-carbon composites, and which is durable and has good adhesion to such composites, particularly at elevated temperatures.

An additional object is to provide procedure for applying the above coating to a carbon-carbon composite.

DETAILED DESCRIPTION OF THE INVENTION AND THE PREFERRED EMBODIMENTS

The initial layer formed on the outer surface of the carbon-carbon composite is a layer of silicon carbide. Such silicon carbide layer can be formed on the outermost surface of the composite by either conventional or plasma-assisted chemical vapor deposition (CVD) reactions of silicon compounds or by direct reaction of silicon with the carbon-carbon substrate.

Conventional CVD achieves the deposition of silicon carbide by the decomposition of methyltrichlorosilane ($CH_3SiCl_3$) at 1200° C. The carbon-carbon composite is placed in a reaction chamber, the chamber is evacuated and heated and the reactants, methyltrichlorosilane and hydrogen, are allowed to flow in. Typical conditions are 50 $cm^3$ of $CH_3SiCl_3$/min, a $H_2/CH_3SiCl_3$ ratio of 10, and a pressure of 0.2 MPa (2 atm). However, the parameters can be varied somewhat.

For the plasma-assisted CVD reaction, the carbon-carbon composite is placed in a chamber, the chamber is evacuated and heated and the reactants, e.g. silane ($SiH_4$) and hydrocarbon $C_xH_y$, are introduced into the chamber, where they decompose and subsequently deposit SiC on the outer surface of the carbon-carbon composite. The temperature of the substrate can be in the range of 200° C. to 500° C. After the desired thickness, e.g. 1 to 250 um, of SiC is laid down, the part is removed and allowed to cool.

Alternatively, the silane alone, $SiH_4$, can be used in the vapor phase and reacted with the carbon of the carbon-carbon composite to form SiC. In a similar manner, silicon chloride or elemental silicon in the vapor phase can be reacted directly with the carbon-carbon composite substrate to form the silicon carbide layer, or used to seal any uncoated carbon-carbon composite surfaces if one of the former silicon carbide deposition techniques is used.

A second layer consisting of a glass, glass-ceramic or low-melting point metal, is applied over the initial layer of silicon carbide. This second layer seals any cracks that occur in the SiC layer. The term, "glass" as employed herein is intended to include $SiO_2$ (pure silica) and silica-containing glass. When glass or a glass-ceramic is used it can be deposited, for example, by sol-gel deposition, slurry techniques, electrospraying or sputtering procedures. Silica, a silica-containing glass, or a glass-ceramic, e.g. magnesium aluminosilicate or a borosilicate glass, can be used for higher temperature operations. In the sol-gel technique, according to a preferred mode of procedure, the solution, e.g. containing tetraethylorthosilicate (TEOS) is placed or applied on the SiC layer of the carbon-carbon composite substrate. The solution is then heated to drive off the solvent, followed by hydrolysis for converting the composition to a gel. Subsequently, heating and sintering at about 1600° C. is carried out to form a silica glass coating. This liquid treatment is particularly appropriate if small channels within the carbon-carbon composite are to be coated. In the slurry technique, a mixture of the glass in water can be placed on the silicon carbide layer of the carbon-carbon composite. It is then heated to evaporate the water and subsequently melt the glass.

Electrospraying of the glass on the silicon carbide layer of the carbon-carbon composite can be initiated by placing the components of the glass in a crucible, and heating the mixture to form the glass, similar to the standard technique for making glasses. The resulting glass is then ground down into a fine powder, which is then agitated by a stream of flowing air to form a fluidized bed. The particles from the fluidized bed are then carried by a flowing gas stream, such as air, passing through the fluidized bed, and the gas stream containing the fluidized glass particles in suspension is then passed through a conventional electrospraying apparatus so that the particles acquire an electrostatic charge. The carbon-carbon composite substrate to which the particles are to be applied is grounded, and the glass particles are sprayed onto the grounded substrate, where the glass particles become electrostatically adhered to the substrate. The substrate is then heated to form the particles of glass directly on the SiC layer of the composite.

Silica deposition by sputtering can be carried out by reactive sputtering, wherein silicon is sputtered in an oxygen atmosphere to lay down $SiO_2$. Alternatively, it can be accomplished by sputtering $SiO_2$ and depositing it directly on the silicon carbide layer. A high-frequency potential at the target is used, which periodically neutralizes the positive charge that accumulates on the target by using plasma electrons during a portion of each cycle.

In all of the above procedures, care is taken to avoid any oxidation of the carbon-carbon substrate or additional oxidation of the SiC, beyond a desired amount. This is done by using standard techniques, such as an inert atmosphere.

The thickness of the glass or glass-ceramic layer can range from about 0.1 to about 10 mils.

When a low-melting-point metal is used as the second layer, such metal is preferably tin or a tin alloy such as Sn—Al. The metal is melted, applied over the SiC layer on the carbon-carbon composite, and then the metal is allowed to cool. The thickness of such metal layer can be about the same as the above noted thickness of the glass layer.

When tin or a tin alloy is used, the maximum operating temperature of the resulting composite system is of the order of about 1,000° C. (1832° F.), and when glass is used the maximum operating temperature is about similar.

In preferred practice when a glass or a glass-ceramic is used as the second layer, e.g. a silica-containing glass, the initial SiC layer is pretreated to form a thin layer of $SiO_2$, prior to applying such second layer. Such pretreatment to form an intermediate, thin $SiO_2$ layer between the silicon carbide and glass or glass-ceramic layers provides oxidation protection for the silicon carbide and also enhances adhesion of the silicon carbide layer to the glass or glass-ceramic layer. The pretreatment can be carried out by oxidation of the outer surface of the silicon carbide by heating the silicon carbide layer in air, e.g. at a temperature of about 1600° C., to form the thin layer of $SiO_2$ on the silicon carbide.

However, in some instances, where a low-melting-point metal is used, the initial SiC layer also can be pretreated by oxidation as described above, if it is found to improve the adhesion of the metal to the SiC layer.

The thickness of the pretreatment layer of $SiO_2$ can range from about 0.01 to about 200 $\mu$m.

When forming the $SiO_2$ glass layer, alkali metal, e.g. sodium, or alkaline earth metal, cations, e.g. barium, can be added to the $SiO_2$ to decrease the viscosity of the resulting glass, which also aids in sealing cracks in the silicon carbide layer. For this purpose, alkali metal oxides such as sodium oxide and potassium oxide, and alkaline earth metal oxides such as barium oxide, strontium oxide or magnesium oxide, can be added to the $SiO_2$. This can be achieved, for example, by adding a suitable organo-metallic compound such as a metal alkoxide containing, for example, the Na or Ba cation, into tetraethylorthosilicate, and when the TEOS containing such compound is heated to form $SiO_2$ or the $SiO_2$-containing glass, as noted above, such organic compound decomposes, leaving only the corresponding alkali metal oxide or alkaline earth metal oxide, such as $Na_2O$ or BaO. The mole percentage of alkali metal or alkaline earth metal oxide, e.g. $Na_2O$, present in the resulting mixture of alkali metal oxide or alkaline earth metal oxide, and $SiO_2$, e.g. $Na_2O$-$SiO_2$, can range from about 5 to about 30%. Addition of alkali or alkaline earth oxides to the $SiO_2$ glass also serves to decrease gas permeation through the glass. Thus, the mole percentage of the additive can be selected for each intended use to optimize the viscosity of the resulting glass and the hydrogen diffusion barrier properties of the overall coating.

Thus, in preferred practice, a thin layer of $SiO_2$ can be formed on the SiC layer by oxidation, as noted above, followed by application of a thick layer of $SiO_2$ deposited from TEOS, as noted above, the thick layer of $SiO_2$ functioning as the glass layer. The above noted alkali metal or alkaline earth metal cations can be added to the TEOS in forming the $SiO_2$ glass layer. Alternatively, the glass layer containing alkali metal or alkaline earth metal cations can be formed by any of several glass-producing techniques. The pretreatment $SiO_2$ layer enhances adhesion of the thick $SiO_2$ glass layer to the SiC.

The following are examples of practice of the invention:

EXAMPLE 1

Coating Formed of Silicon Carbide, Oxidation Treatment and Silica Glass

A layer of silicon carbide is formed on the outermost layer of carbon in a carbon-carbon composite by chemical vapor deposition (CVD). The carbon-carbon composite is placed in a chamber, and the chamber is evacuated and heated to 1200° C. The reactants, methyltrichlorosilane ($CH_3SiCl_3$), hydrogen, are allowed to flow in. Conditions are 50 cm$^3$ of $CH_3SiCl_3$/min, a $H_2$/$CH_3SiCl_3$ ratio of 10 and a pressure of 0.2 MPa (2 atm).

The outer surface of the resulting SiC layer is oxidized by heating it in flowing air for 5 minutes at 1600° C. This produces an $SiO_2$ layer approximately 0.1 $\mu$m on the SiC layer.

Finally, a layer of silica glass is laid down using tetraethylorthosilicate (TEOS). The TEOS is first partially reacted by dropping it into a solution of 0.15 molar HCl and ethyl alcohol. The molar ratio of the TEOS to water is one to four. The amount of ethyl alcohol is about 50 volume percent of the total. After stirring the solution for 2 hours at 30° C., the solution is then applied to the oxidized SiC, to the desired thickness calculated to give a final thickness between 0.1 and 10 mils, as desired, and heated to 1000° C. for 1 hour, to form the silica glass layer.

If increased density is required, the article may be heated to 1750° C. for one hour, and then cooled. If desired, multiple layers may be deposited using the sol-gel technique. Also for thicker layers, sputtering may be used to deposit the silica.

EXAMPLE 2
Coating Formed of Silicon Carbide, Oxidation Treatment, and a Glass-Ceramic The procedure set forth in Example 1 is followed, except that in place of the silica glass, a glass-ceramic layer is applied. The glass-ceramic used is a magnesium aluminosilicate having the composition 12.5% MgO, 30.5% $Al_2O_3$, 45.5% $SiO_2$ and 11.5% $TiO_2$. The $TiO_2$ is present as a nucleating agent. The glass is applied as a frit. This material is then heated from room temperature to the nucleation temperature (i.e. the temperature at which its viscosity is $10^{11.5}$ poises approximately 875° C.) at a rate of 5° C./minute. The glass is held at this temperature for 1½ hours. Then a rate of heating of 5° C./min is used to bring the material to 1350° C., at which temperature it is held for 1½ hours. It is then allowed to cool at a rate of approximately 5° C./min. The glass-ceramic layer has a thickness of about 10 mils. Care is taken throughout the procedure to ensure that the carbon-carbon composite does not oxidize.

Barium magnesium aluminosilicate can be used if easier processing and better strength and toughness are required.

EXAMPLE 3
Coating Formed of Silicon Carbide and a Low-Melting-Point Metal

The initial procedure of Example 1 is followed to deposit the silicon carbide layer on the carbon-carbon substrate. The final layer is a low-melting-point metal or alloy, such as tin, applied in a layer from 0.1 to 10 mils thick. The tin can be applied in various ways, a convenient method being to melt it and apply it as a liquid.

EXAMPLE 4
Coating Formed of Silicon Carbide and a Sodium-Containing Glass

The procedure of Example 1 is repeated, except that $Na_2O$ is added to the TEOS, in the form of a solution of the compound sodium methoxide so that upon heating the solution, $Na_2O$ is formed in an amount of about 20 mole percent in the $Na_2O$-$SiO_2$ mixture.

From the foregoing, it is seen that the invention of this application provides an effective, durable and adherent hydrogen diffusion barrier coating on carbon-carbon composites, comprised basically of two layers, namely, a first layer of silicon carbide and a second layer of a glass, glass-ceramic or a low-melting-point metal such as tin, and particularly when such second layer is a glass, or glass ceramic, interposing an intermediate thin layer of $SiO_2$ between the first and second layers to increase adhesion between such layers. The coating of the invention also provides protection against oxidation of the carbon-carbon composite.

It is to be understood that what has been described is merely illustrative of the principles of the invention and that numerous arrangements in accordance with this invention may be devised by one skilled in the art without departing from the spirit and scope thereof.

What is claimed is:

1. A process for producing a coating to seal carbon-carbon composites against hydrogen, which comprises
    forming a first layer of silicon carbide on a carbon-carbon composite, and
    applying a second layer selected from the class consisting of a glass, a glass-ceramic and a low-melting point metal over said first layer.

2. The process of claim 1, and including the step of forming a layer of $SiO_2$ on said silicon carbide layer prior to applying said second layer, for enhancing adhesion of said silicon carbide layer with such second layer.

3. The process of claim 1, said layer of silicon carbide formed by chemical vapor deposition or plasma-assisted chemical vapor deposition.

4. The process of claim 1, said layer of silicon carbide formed by direct reaction of silicon with said carbon-carbon composite.

5. The process of claim 1, said second layer being a silica-containing glass.

6. The process of claim 5, including adding alkali metal or alkaline earth metal cations to the silica-containing glass.

7. The process of claim 1, said second layer consisting of a low-melting-point metal.

8. The process of claim 7, said low-melting-point metal being tin or a tin alloy.

9. The process of claim 2, said step of forming said layer of $SiO_2$ being carried out by pretreatment of said silicon carbide layer by oxidation in air prior to applying said second layer.

10. The process of claim 9, said second layer being a silica-containing glass, said step of applying said glass layer being carried out by sputtering silicon in an oxygen atmosphere or by sputtering $SiO_2$ on the oxidized silicon carbide layer.

11. The process of claim 9, said second layer being a silica-containing glass, said step of applying said glass layer being carried out by treatment of said oxidized silicon carbide layer with tetraethylorthosilicate and heating same to form said silica-containing glass.

12. The process of claim 11, including adding a metal alkoxide to said tetraethylorthosilicate.

13. The process of claim 12, said metal alkoxide forming the alkali metal oxide $Na_2O$, the mole percentage of $Na_2O$ present in the resulting $Na_2O$—$SiO_2$ mixture ranging from about 5 to about 30%.

14. The process of claim 1, wherein said second layer is a magnesium aluminosilicate or a borosilicate glass.

15. A process for producing a coating to seal carbon-carbon composites against hydrogen diffusion, which comprises
    forming a layer of silicon carbide on a carbon-carbon composite,
    forming a thin layer of $SiO_2$ on said silicon carbide layer by oxidation of the surface of said silicon carbide layer, and
    applying a silica-containing glass layer over said thin $SiO_2$ layer.

16. The process of claim 15, said silica-containing glass layer comprised of $SiO_2$ containing a substance selected from the group consisting of an alkali metal oxide and an alkaline earth oxide.

* * * * *